(12) United States Patent
Lemaire

(10) Patent No.: US 6,791,158 B2
(45) Date of Patent: Sep. 14, 2004

(54) INTEGRATED INDUCTOR

(75) Inventor: Frédéric Lemaire, Saint Egreve (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/343,897

(22) PCT Filed: Aug. 3, 2001

(86) PCT No.: PCT/FR01/02546
§ 371 (c)(1),
(2), (4) Date: May 22, 2003

(87) PCT Pub. No.: WO02/13212
PCT Pub. Date: Feb. 14, 2002

(65) Prior Publication Data
US 2003/0178694 A1 Sep. 25, 2003

(30) Foreign Application Priority Data
Aug. 4, 2000 (FR) .............................. 00 10340

(51) Int. Cl.[7] .............................................. H01L 29/00
(52) U.S. Cl. ...................... 257/531; 257/499; 257/528; 438/329
(58) Field of Search ................................ 257/499, 528, 257/531; 438/329

(56) References Cited

U.S. PATENT DOCUMENTS 6,169,320 B1 * 1/2001 Stacey ........................ 257/531

* cited by examiner

Primary Examiner—Nathan J. Flynn
Assistant Examiner—Scott R. Wilson
(74) Attorney, Agent, or Firm—Lisa K. Jorgenson; Robert Iannucci; Seed IP Law Group PLLC

(57) ABSTRACT

The invention concerns an intgrated inductor (20), consisting of a flat winding of one or several turns (21, 22, 23) made of a conductive material above a substrate provided with at least a subjacent conductive level wherein is produced, through a contact pick-up strip (12'), at least an intersection of the winding, the width of at least one turn and/or one interval between two turns being reduced in line with said contact pick-up strip.

20 Claims, 2 Drawing Sheets

INTEGRATED INDUCTOR

The present invention relates to the field of integrated circuits, and more specifically to the manufacturing of an inductance formed above a semiconductor substrate.

Figure 1A:
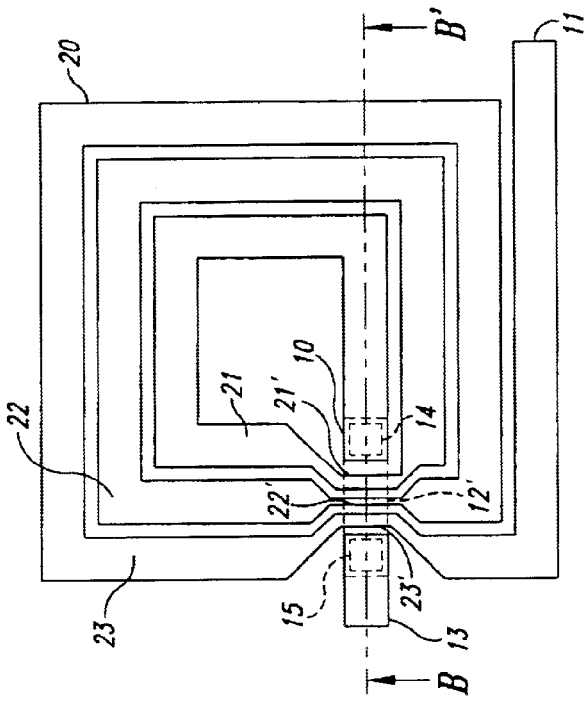
Figure 1B:
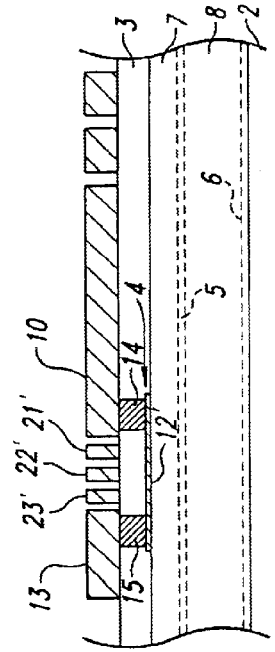

FIGS. 1A and 1B show, respectively in a top view and in a cross-section view along line B-B' of FIG. 1A, a conventional example of an inductance 1 formed above a semiconductor substrate 2. Inductance 1 includes a number of generally concentric turns or spirals (at least one spiral) obtained by the deposition of a conductive element on an insulating layer 3 (FIG. 1B). Insulating layer 3, for example, silicon oxide, rests on the last metallization level 4 added on substrate 2 after forming of integrated components in this substrate. In the example of FIG. 1B, two other metallization levels 5, 6 have been illustrated in dotted lines between substrate 2 and upper level 4. Each level is of course separated from the underlying level by an insulating layer, respectively 7, 8. The conductive element of inductance 1 is conventionally of constant width and thickness. It is deposited on insulating layer 3, in the form of a flat winding from a first internal end 10 to a second external end 11.

To enable connection of inductance 1 to the rest of the integrated circuit or to a terminal of a package, it is necessary to provide a contact recovery from internal end 10 of the winding to the outside of this winding. Conventionally, this contact recovery is obtained by using an underlying metallization level (generally, upper level 4). A conductive track 12 (generally rectilinear) is formed therein between the location under internal end 10 of inductance 1 and the location under a pad 13 outside of the winding. Pad 13 is formed on insulating layer 3 in the same conductive material as the winding of inductance 1. Vias 14 and 15 (for example, made of tungsten) electrically connect end 10 and pad 13 to the respective ends of underlying track 12.

In the forming of an inductance, its quality factor is generally desired to be optimized. Among the parameters having an influence upon this quality factor, the parasitic resistance (series resistance) is a major parameter. To reduce the resistance of the conductive element against the flowing of current, its section is generally desired to be maximized. Not only the thickness, but also the width of the spirals of inductance 1 are then increased.

A disadvantage is that the contact recovery from the internal end of the winding introduces a series resistance that annuls the beneficial effects of the section increase of this winding. Indeed, the thickness of the metal levels underlying the winding is imposed by the technology in which the other components integrated with the inductance are manufactured.

For example, the metallization levels are formed in aluminum deposited over a thickness from 0.8 to 1 $\mu$m. The conductive level added on top of the structure and in which the spirals are formed has, in the case of aluminum, a thickness on the order of 2.5 $\mu$m. However, to avoid adversely affecting the integrated circuit manufacturing, such a thickness increase is only conceivable on the last deposited level.

This problem is posed whatever the number of spirals of the inductance and whatever the conductive materials used. Further, it is more generally encountered each time a crossing is desired to be made in a winding of an integrated inductance.

The present invention aims at providing a novel integrated circuit inductance that overcomes the disadvantages of known inductances.

The present invention more specifically aims at solving the problems associated with the contact recovery from the internal end of the inductance.

More generally, the present invention aims at providing a solution to the problem of crossing, by contact recovery in a lower level, of a flat winding of an inductance.

To achieve these objects, the present invention provides an integrated inductance, formed of a flat winding of at least one spiral made of a semiconductor material above a substrate provided with at least one underlying conductive level, in which the winding is crossed at least once by a contact recovery track, the spiral width being reduced above said contact recovery track.

The present invention also provides an integrated inductance, formed of a winding of several spirals, the width of at least one spiral and/or of at least one interval separating two spirals being reduced above said contact recovery track.

According to an embodiment of the present invention, the crossing is used for the contact recovery from an internal end of the winding to an external pad.

According to an embodiment of the present invention, the pattern of the spirals is such that the external spiral is, at the level of the contact recovery, closer to the center of the winding than the rest of this external spiral.

According to an embodiment of the present invention, the resistance per square of the conductive material constitutive of the winding is substantially smaller than the resistance per square of the underlying conductive level in which is formed the contact recovery, the thickness of the conductive material constitutive of the winding being, preferably, substantially greater than the thickness of the underlying conductive level.

According to an embodiment of the present invention, the intervals, in the contact recovery alignment, between the two connected winding portions, are minimized.

According to an embodiment of the present invention, the length of the narrowed section(s), which depends on the width of the contact recovery track, is chosen to be as short as possible.

According to an embodiment of the present invention, the conductive material is aluminum, the underlying conductive level being also made of aluminum.

According to an embodiment of the present invention, said conductive material is copper having a thickness of several tens of micrometers, the underlying conductive level being made of aluminum of a thickness on the order of one micrometer.

According to an embodiment of the present invention, said conductive level is formed by the upper metallization level used for the interconnections of other components of the integrated circuit.

The foregoing objects, features and advantages of the present invention will be discussed in detail in the following non-limiting description of specific embodiments in connection with the accompanying drawings.

Figure 2A:
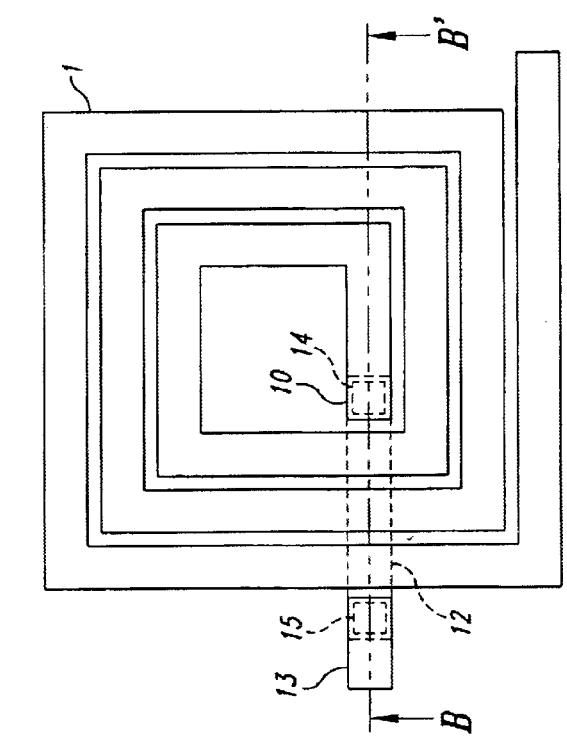
Figure 2B:
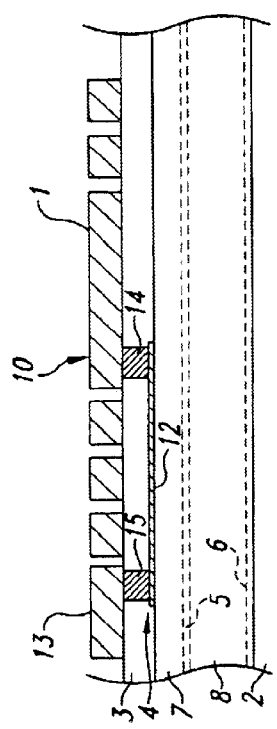
Figure 3A:
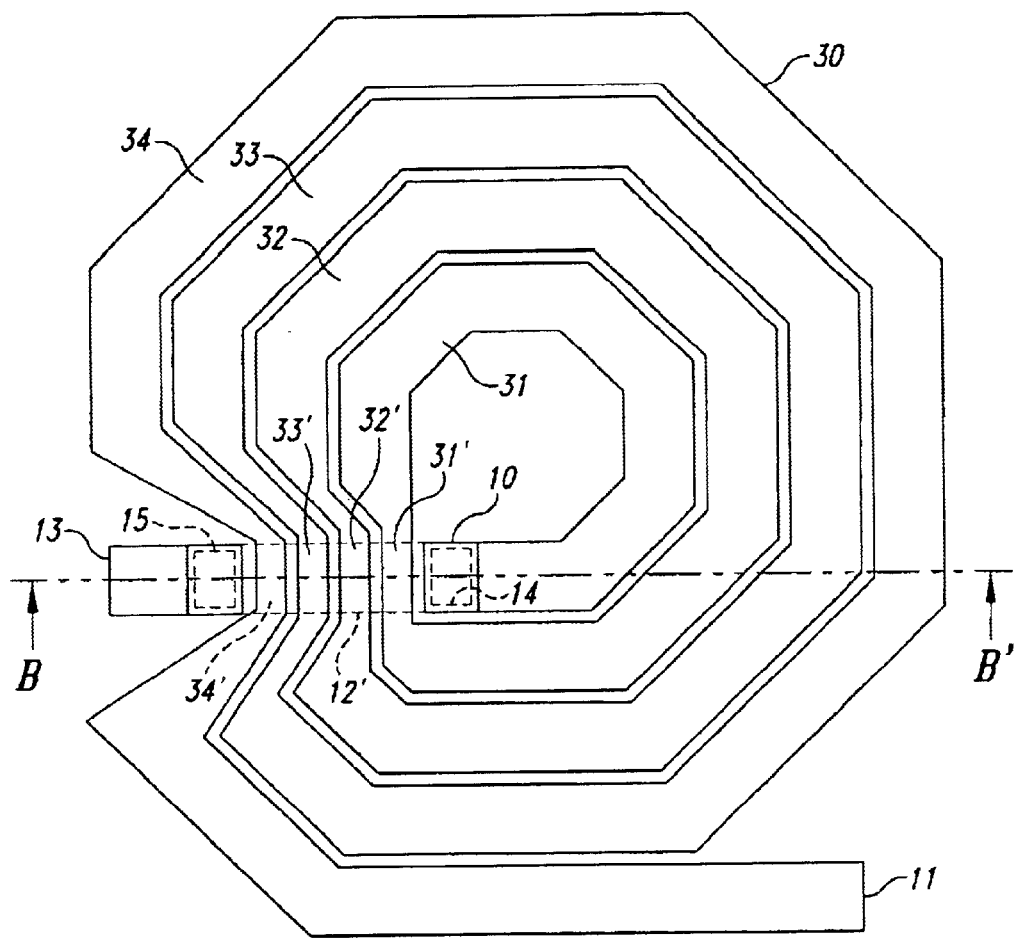
Figure 3B:
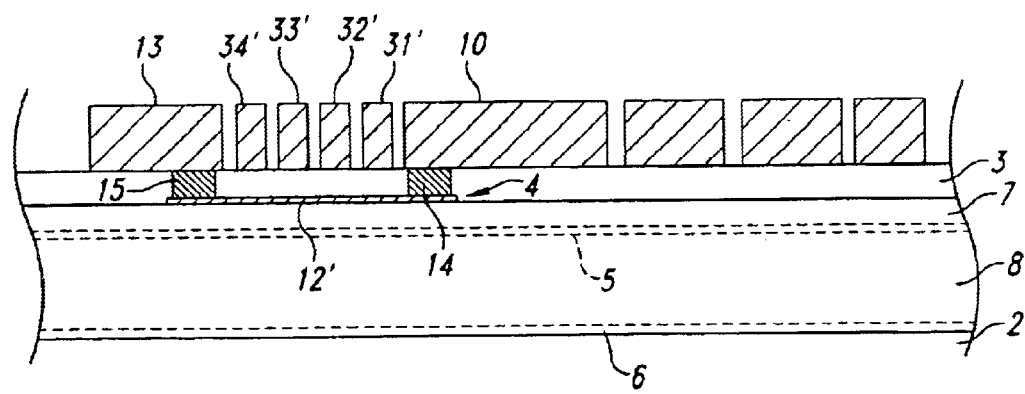

FIGS. 1A and 1B, previously described, respectively show in a top view and in a cross-section view a conventional example of an integrated circuit inductance;

FIGS. 2A and 2B show, respectively in a top view and in a cross-section view, an embodiment of an integrated inductance according to the present invention; and FIGS. 3A and 3B illustrate, by representations of an integrated inductance, respective in top view and in cross-section view, alternative embodiments of the present invention.

The same elements have been designated with the same references in the different drawings. For clarity, only those elements that are necessary to the understanding of the present invention have been shown in the drawings and will be described hereafter. In particular, the components with which one or several inductances are integrated on the semiconductor substrate have not been shown in the drawings and are no object of the present invention.

A feature of the present invention is to provide a narrowing of the conductive element constitutive of a winding of an integrated inductance, above an underlying conductive track enabling, by a contact recovery, crossing of the winding. Such a localized narrowing of the winding spiral(s) enables reducing the length of the underlying contact recovery section, and thus the series resistance of the inductance. In an inductance with several spirals, a feature of the present invention is to provide, above the underlying contact recovery, a narrowing of at least one spiral of the conductive element and/or of at least one insulating interval between spirals.

The present invention will be described hereafter in relation with examples of contact recovery of an internal end of the winding. However, all that will be discussed hereafter more generally applies to a crossing at any point of the winding.

FIGS. 2A and 2B show, respectively in a top view and in a cross-section view along line B-B' of FIG. 2A, an embodiment of an integrated inductance according to the present invention.

Conventionally, an inductance 20 according to the present invention is formed of one or several spirals of a conductive element deposited above a semiconductor substrate 2 in which integrated circuits have been formed. Inductance 20 is deposited flat on an insulating layer 3 covering the last metallization level 4 of the integrated circuit. The example of FIG. 2B shows the same metal level 5, 6 and insulating levels 7, 8 as in the example previously described in relation with FIG. 1B. In the example of FIG. 2A, inductance 20 includes three and one quarter spirals of square shape. However, an inductance according to the present invention may have any shape (round, oval, or polygonal) and also any number of spirals. The use of rectilinear sections however simplifies the manufacturing.

As previously, a contact recovery is provided from internal end 10 of the winding to a pad 13 external to this winding. This contact recovery is performed by means of a conductive track 12' obtained, for example, in the last metallization 4 underlying the conductive element constitutive of inductance 20. Internal end 10 and pad 13 are connected to the respective ends of track 12' by means of vias 14, 15.

As an alternative, in a circuit with several metallization levels, several superposed tracks may be used in the successive metallization levels to form the contact recovery. These tracks are then connected in parallel by means of vias crossing the different insulating layers 3, 4, and 8. Indeed, these metallization levels are available since the inductance is generally placed on a portion of the substrate containing no other component. However, this solution leads to using levels closer and closer to the substrate, which increases stray capacitances between the winding and the substrate. The choice of this alternative depends on the desired compromise between the decrease of the series resistance and the increase of such capacitances. According to another alternative, the first metallization level used will not be the level closest to the winding. In this case, the stray capacitance between the winding and the contact recovery is decreased.

According to the embodiment shown in FIGS. 2A and 2B, each spiral 21, 22, or 23 that must run above contact recovery track 12' exhibits, above said track 12', a narrowed section, respectively 21', 22', and 23'. As seen from above, narrowing 22' of intermediary spiral 22 is, for example, aligned with the rest of the rectilinear section in which it is formed. Narrowings 21' and 23' are then not aligned with the rest of the corresponding sections of spirals 21 and 23 to bring sections 21' and 23' as close as possible to section 22'. The connection between each narrowed section and the rest of the corresponding spiral may have any shape (for example, oblique, as shown, or with a right angle). The narrowings enable reducing the length of track 12' with respect to a same track which would have to cross sections 21, 22, and 23 in their non-narrowed portions. For spirals with rectilinear sections, the narrowed sections are parallel to one another and, for example, perpendicular to the contact recovery track, the length of which is desired to be minimized. Accordingly, a contact recovery section according to the present invention has a resistance smaller than that of a conventional section in the same technology. By reducing the resistance of the contact recovery section, the general series resistance of the inductance is decreased and its quality factor is thus increased.

It could have been thought that by narrowing the conductive spirals, the series resistance of the corresponding sections is increased in such a way that the length decrease of the contact recovery track is useless. However, this does not occur. First, the narrowing provided by the present invention is localized and the shortest possible to minimize the resistance introduced in each spiral. Further, this narrowing does not go along with a thinning down, so that the cross-section of sections 21', 22', and 23' remain relatively large (especially as compared with the underlying level). Moreover, integrated inductances are generally used for high-frequency applications where the current in the inductance is essentially a function of the perimeter of its cross-section (skin effect). Accordingly, if the spirals are sufficiently thick (thicker than they are wide), the inductance is not debased by the narrowings provided by the present invention.

Taking the preceding example of an aluminum conductive element of a 2.5$\mu$m thickness placed on a stacking of aluminum metallization levels of 0.8 $\mu$m, a narrowing down to a 2$\mu$m width (if allowed by the series resistance then introduced) can be provided in spirals having for the rest a given width ranging, for example, between one and a few tens of $\mu$m.

In an alternative (not shown) where only the intervals between spirals are narrowed above the contact recovery, the series resistance of the winding is not modified.

The minimum width of the conductive sections of the inductance and the intervals between spirals is essentially linked to the technological process used according to the thickness of these conductive sections.

For example, to improve the conductivity of the inductance, copper, which can then be deposited in a much thicker layer to form the inductance, is also used. Copper thicknesses of several tens of $\mu$m (for example, approximately 30 $\mu$m) can then be obtained. With such a technology, the minimum width and the spacing are approximately half the thickness (that is, for example, approximately 15 $\mu$m). The width of the non-narrowed sections is for example on the order of 30 to 40 $\mu$m. The underlying metallization levels remain, for example, made of aluminum.

Of course, the nature of the material and/or its thickness may be modified. What matters is that the resistance per square of the conductive element of the winding is smaller than the resistance per square of the metallization level containing the contact recovery.

FIGS. 3A and 3B illustrates alternative embodiments of an inductance according to the present invention. FIG. 3A is a top view and FIG. 3B is a cross-section view along line B-B' of FIG. 3A.

The embodiment illustrated in FIGS. 3A and 3B is a hexagonal inductance 30 having four spirals and one third, formed of rectilinear sections. In addition to the shape variation, this embodiment includes another variation in the arrangement of narrowings 31', 32', 33', and 34' of spirals 31, 32, 33, and 34 above track 12' of transfer of internal end 10 of inductance 30 to external pad 13. In the embodiment of FIGS. 3A and 3B, these narrowings are brought as close as possible to internal end 10 of inductance 30, while in the embodiment of FIGS. 2A and 2B, these narrowings enable bringing spirals 21 and 23 closer symmetrically with respect to second spiral 22. Other alternatives are possible. For example, its may be provided to bring the narrowed sections closer to external spiral 34 rather than to internal spiral 31. In this case, internal end 10 of the inductance is also brought closer to external spiral 34.

According to another embodiment not shown, the inductance is said to be "symmetrical" and includes a crossing approximately equidistant from the ends of the winding which are both outside of it. In the case of a winding with several spirals, there are then several crossings, each contact recovery running under a single spiral.

An advantage of the present invention is that it reduces the series resistance of the inductance with respect to a conventional inductance. On the one hand, by reducing the length of the contact recovery track, the capacitance between said track and the substrate is reduced. On the other hand, by narrowing the spirals, the capacitance between the winding and the contact recovery is reduced.

Another advantage of the present invention is that it decreases the integrated circuit surface area in which the inductance is inscribed. Indeed, by bringing the spirals closer towards the inside at the level of their narrowing, external connection pad 13 is brought closer to the center of the winding. This advantage especially appears from FIG. 3A.

Of course, the present invention is likely to have various alterations, modifications, and improvements which will readily occur to those skilled in the art. In particular, the respective sizing of the inductance sections, of their narrowing and of the underlying contact recovery track depend on the application and are to be adapted case by case by those skilled in the art. Further, the contact recovery level may be formed by any metallization or polysilicon level, or even by a substrate region. Finally, the winding itself may include several conductive levels in parallel (connected by vias) provided that the winding has, at least in one of these levels, a resistance per unit length smaller than that of the contact recovery.

What is claimed is:

1. An integrated inductance, formed above a semiconductor substrate supporting a conductive contact recovery track, comprising:
a flat winding having a turn and positioned above the substrate, in which the winding has a first winding portion that crosses above the contact recovery track, wherein the winding portion above said contact recovery track has a width that is reduced compared to a second winding portion that is not directly above the contact recovery track.

2. The inductance of claim 1, wherein the contact recovery track contacts and extends from an internal end of the winding to an external pad.

3. The inductance of claim 1, wherein the winding is conductive and has a resistance per square that is substantially smaller than a resistance per square of the contact recovery track, the winding having a thickness substantially greater than a thickness of the contact recovery track.

4. The inductance of claim 1, wherein the winding includes a third winding portion that crosses above the contact recovery track and is separated from the first winding portion by a first interval, and a fourth winding portion that is not directly above the contact recovery track and is separated from the second winding portion by a second interval that is greater than the first interval.

5. The inductance of claim 1, wherein the first winding portion has a length, which depends on the width of the contact recovery track, that is chosen to be as short as possible.

6. The inductance of claim 1, wherein the winding and the contact recovery track are made of aluminum.

7. The inductance of claim 1, wherein the winding is copper having a thickness of several tens of micrometers, the contact recovery track being made of aluminum of a thickness on the order of one micrometer.

8. The inductance of claim 1, wherein said contact recovery track is part of a conductive level formed by an upper metallization level used for interconnections of other components of an integrated circuit formed in the substrate.

9. The inductance of claim 1 wherein the winding includes a plurality of concentric spirals having respective first winding portions that respectively cross over the contact recovery track and remainders that do not cross the contact recovery track, each first winding portion having a reduced width compared to the remainder of the spiral.

10. An integrated inductance, formed above a semiconductor substrate that supports a conductive contact recovery track, comprising a winding of several turns, in which the winding includes first and second winding portions that each cross the contact recovery track and are separated from each other by a first interval, wherein at least one of the first and second winding portions is reduced compared to a third winding portion that does not cross the contact recovery track or the first interval is reduced compared to intervals between portions of the winding that do not cross the contact recovery track.

11. The inductance of claim 10, wherein the winding has an external turn with a turn portion adjacent to the contact recovery track that is closer to a center of the winding than is the rest of the external turn.

12. An inductance device, comprising:
a semiconductor substrate;
a conductive contact recovery track supported by the substrate and having first and second ends;
an insulating layer on the contact recovery track; and
a conductive winding, on the insulating layer, having an internal end and an external end, the internal end being electrically connected to the first end of the contact recovery track, the winding having a winding section with a first width that is directly above the contact recovery track and a second width that is not directly above the contact recovery track, the first width being smaller than the second width.

13. The inductance device of claim 12, wherein the contact recovery track extends from the internal end of the winding to an external pad that is external to the winding.

14. The inductance device of claim 12, wherein the winding has a resistance per square that is substantially smaller than a resistance per square of the contact recovery track, the winding having a thickness substantially greater than a thickness of the contact recovery track.

15. The inductance of claim 12, wherein the winding section includes first, second, third, and fourth winding portions, the first and second winding portions being above and crossing the contact recovery track and being separated from each other by a first interval; the third and fourth winding portions being positioned not directly above the contact recovery track and being separated from each other by a second interval that is greater than the first interval.

16. The inductance of claim 12, wherein the winding section includes first, second, third, and fourth winding portions, the first and second winding portions being above and crossing the contact recovery track and being separated from each other by a first interval; the third and fourth winding portions being positioned not directly above the contact recovery track and being separated from each other by a second interval, the first and second winding portions being narrower than the third and fourth winding portions.

17. The inductance device of claim 12, wherein the first width of the winding section is substantially constant across the contact recovery track and the winding section has an increased width beginning immediately adjacent to the portion of the winding section directly above the contact recovery track.

18. The inductance device of claim 12, wherein the first and second ends of the contact recovery track are separated by a distance that is less than the second width of the winding section.

19. The inductance device of claim 12, wherein the winding includes a plurality of concentric spirals, each of the spirals having a reduced width directly above the contact recovery track compared to the remainder of the spiral.

20. The inductance of claim 12 wherein the winding includes a plurality of concentric spirals having respective first winding portions that respectively cross over the contact recovery track and remainders that do not cross the contact recovery track, each first winding portion having a reduced width compared to the remainder of the spiral.

* * * * *